United States Patent
Yoda et al.

(10) Patent No.: US 6,947,314 B2
(45) Date of Patent: Sep. 20, 2005

(54) MAGNETIC RANDOM ACCESS MEMORY AND METHOD OF MANUFACTURING THE SAME

(75) Inventors: Hiroaki Yoda, Kawasaki (JP); Hisanori Aikawa, Yokohama (JP); Tomomasa Ueda, Yokohama (JP); Tatsuya Kishi, Yokohama (JP); Takeshi Kajiyama, Yokohama (JP); Yoshiaki Asao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/671,743

(22) Filed: Sep. 29, 2003

(65) Prior Publication Data

US 2004/0179393 A1 Sep. 16, 2004

(30) Foreign Application Priority Data

Mar. 11, 2003 (JP) ...................................... 2003-065055

(51) Int. Cl.$^7$ ............................................. G11C 11/00
(52) U.S. Cl. ........................ 365/158; 365/171; 365/173
(58) Field of Search ................................ 365/158, 171, 365/173

(56) References Cited

U.S. PATENT DOCUMENTS 6,621,730 B1 * 9/2003 Lage ........................... 365/158
2002/0034094 A1 * 3/2002 Saito et al. ................... 365/158

OTHER PUBLICATIONS

U.S. Appl. No. 10/329,417, filed Dec. 27, 2002, Amano et al.
U.S. Appl. No. 10/345,253, filed Jan. 16, 2003, Saito et al.
U.S. Appl. No. 10/345,188, filed Jan. 16, 2003, Kishi et al.
U.S. Appl. No. 10/379,656, filed Mar. 6, 2003, Yoda et al.
U.S. Appl. No. 10/396,435, filed Mar. 26, 2003, Amano et al.
U.S. Appl. No. 10/671,743, filed Sep. 29, 2003, Yoda et al.
U.S. Appl. No. 10/671,743, filed Sep. 29, 2003, Yoda et al.
U.S. Appl. No. 10/862,617, filed Jun. 8, 2004, Nagase et al.

* cited by examiner

*Primary Examiner*—Anh Phung
*Assistant Examiner*—Pho M. Luu
(74) *Attorney, Agent, or Firm*—Oblon, Spivak, McClelland, Maier & Neustadt, P.C.

(57) ABSTRACT

A write wiring for writing information in an MTJ device is covered with a magnetic layer. The magnetic layer has a structure in which the growing direction of columnar grains is 30° or less from the normal-line direction of sidewalls, a structure in which grains are deposited like a layer, or a structure in which grains are amorphously deposited.

8 Claims, 11 Drawing Sheets

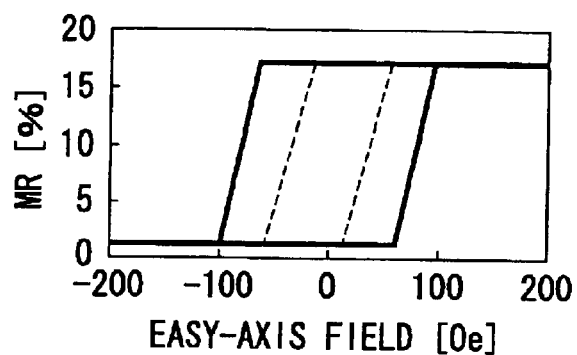
FIG. 6
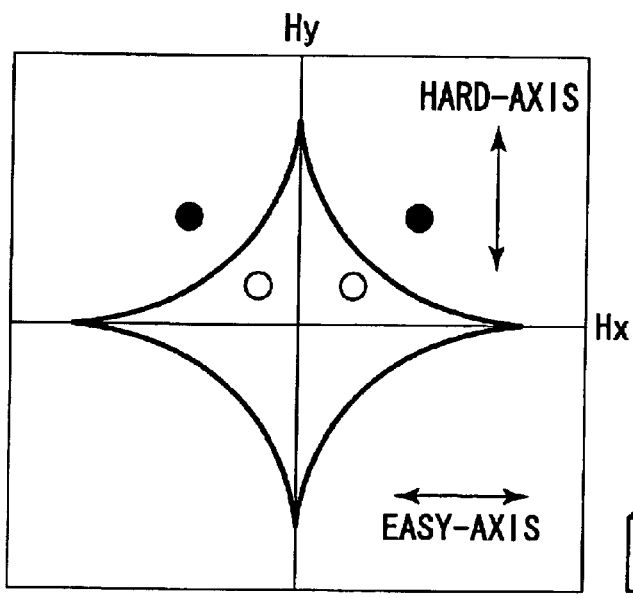
FIG. 7
FIG. 8
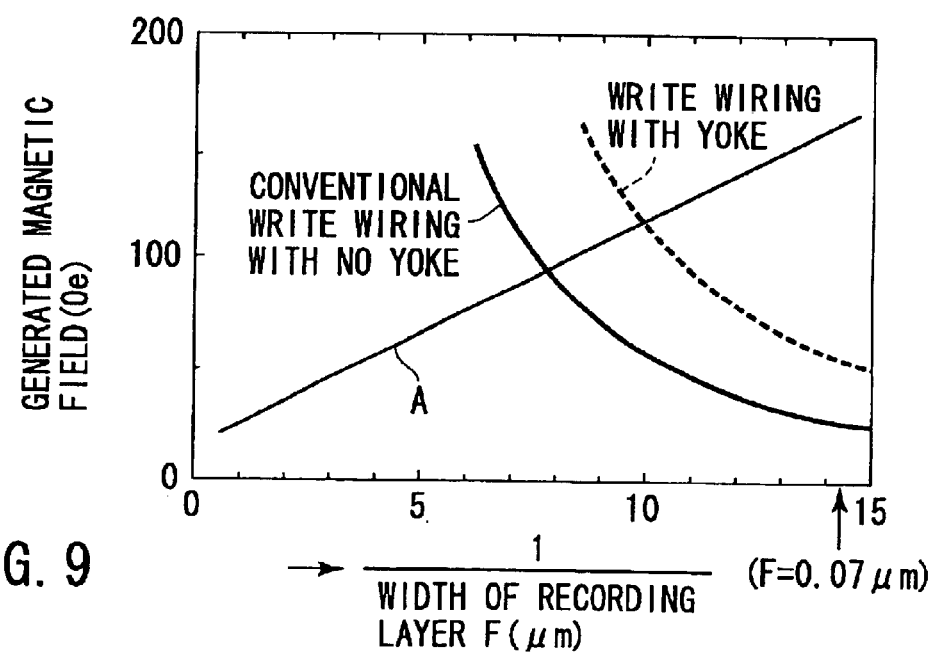
FIG. 9

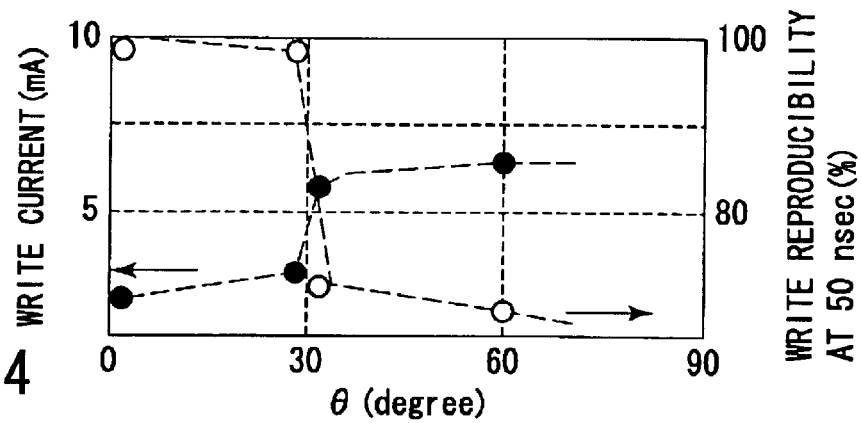
FIG. 14
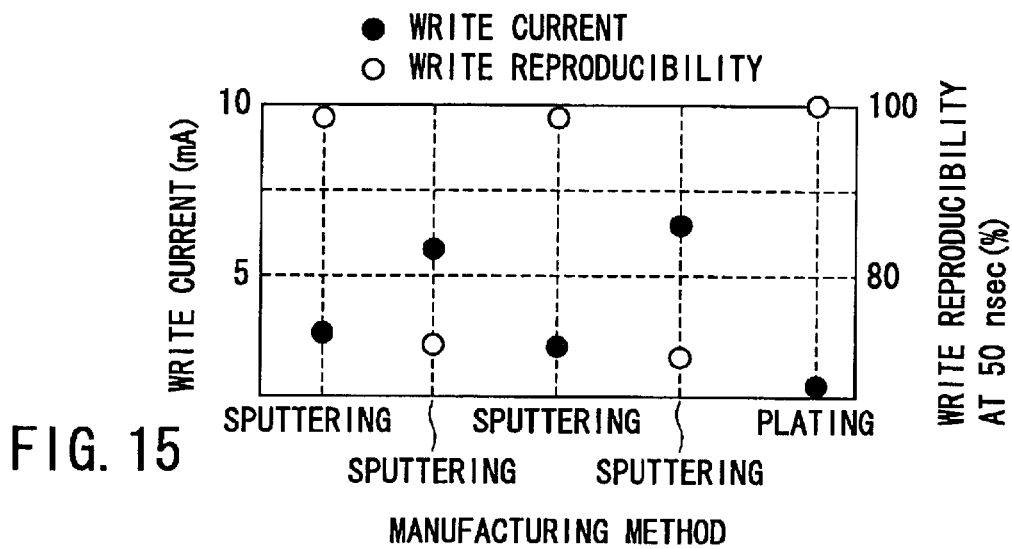
FIG. 15
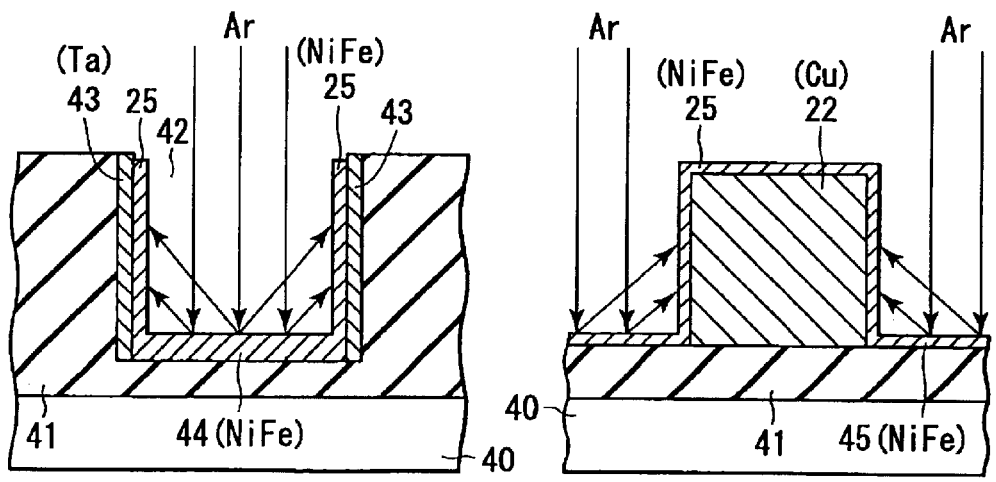
FIG. 16
FIG. 17

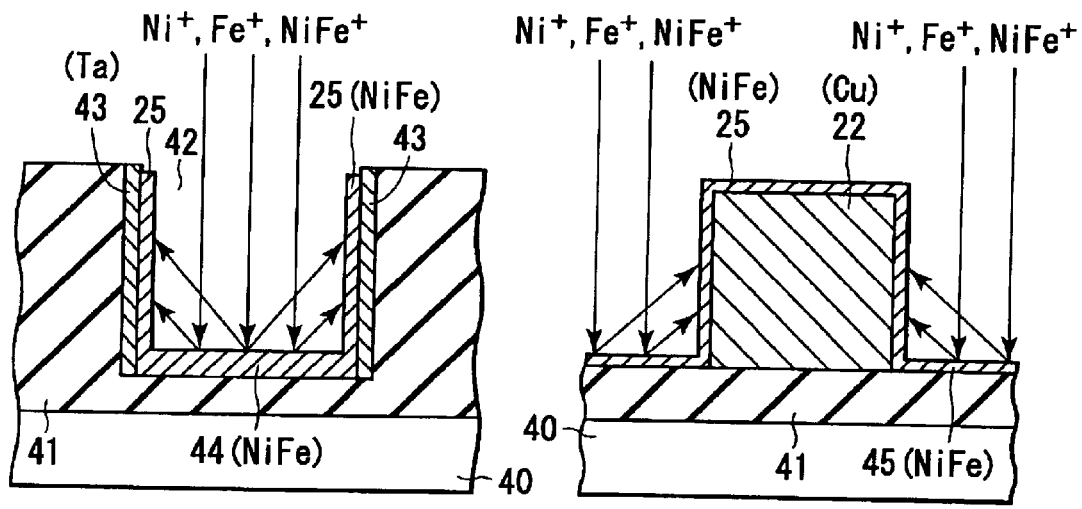
FIG. 18
FIG. 19
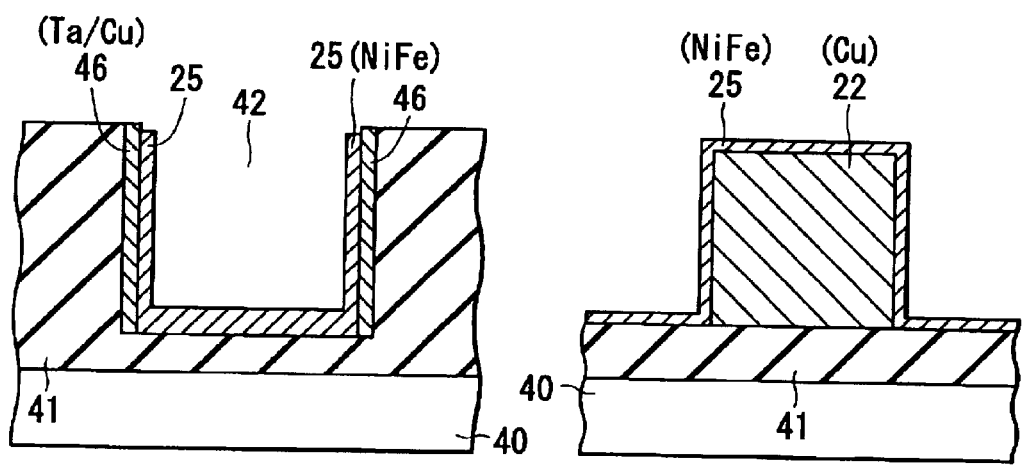
FIG. 20
FIG. 21

TO FIRST MRAM DATA REWRITE CONTROLLER

MAGNETIC RANDOM ACCESS MEMORY AND METHOD OF MANUFACTURING THE SAME

CROSS-REFERENCE TO RELATED APPLICATIONS

This application is based upon and claims the benefit of priority from the prior Japanese Patent Application No. 2003-065055, filed Mar. 11, 2003, the entire contents of which are incorporated herein by reference.

BACKGROUND OF THE INVENTION

1. Field of the Invention

The present invention relates to a magnetic random access memory (MRAM). Moreover, the present invention relates to a structure of a write wiring for writing data in a memory cell of the MRAM.

2. Description of the Related Art

Many memories for storing information in accordance with a new principle have been proposed in recent years. As one of the memories, a nonvolatile and high-speed MRAM in which magnetic memory cells constituted by an MTJ (Magnetic Tunnel Junction) device for storing information of "0" and "1" in accordance with the tunneling magneto resistive effect are arranged like a matrix is described in, for example, Roy Scheuerlein et. al "A 10-ns Read and Write Non-Volatile Memory Array Using a Magnetic Tunnel Junction and FET Switch in each Cell", ISSCC 2000 Technical Digest pp. 128–129.

Data is written in an MTJ device by supplying a current to a write word line and a bit line and making the spin direction of the MTJ device parallel or antiparallel by using a magnetic field generated by the current circulating through the both lines.

It is said that the largest problem of an MRAM is reduction of a write current. An MTJ device reported at present requires a large write current value of 8 to 10 mA when the cell width ranges between 0.4 and 0.6 μm and the cell length is approx. 1.2 μm. Therefore, the MTJ device has a problem on electromigration of a wiring and a problem that a driving circuit occupies a large area.

Even in the case of a test chip of a 1K-bit-level MRAM fabricated by the present inventors by way of trial, a write current also ranges between 8 and 10 mA. To practically use the MRAM, it is indispensable to reduce the write current value to an allowable level such as 1 to 2 mA.

To rewrite data in an MTJ device, it is necessary to invert the magnetizing direction of a recording layer of the MTJ device. A switching field Hsw necessary to rewrite the magnetization information of the recording layer is approximately obtained from the following expression:

$$Hsw = 4\pi \times Ms \times t/F \ (Oe)$$

where Ms denotes saturated magnetization of the recording layer, t denotes a thickness of the recording layer, and F denotes a width of the recording layer.

Reduction of the thickness of the recording layer of an MTJ device is restricted to secure the stability of the information. In the case of an MTJ device in which the width F of the recording layer is decreased to approx. 0.15 μm or less, it is necessary to increase the thickness t of the recording layer.

Even if forming the recording layer by a CoFeNi thin film and setting the thickness of the layer to 2 nm, the switching filed Hsw is intensified and a write current further increases by decreasing the width F of the recording layer and fining the MTJ device.

On the other hand, a current density to be supplied to a wiring has an upper limit. In the case of a copper wiring, the upper limit is approx. $10^7$ A/cm$^2$. Because the sectional area of the wiring decreases as the device is further fined, it is impossible to supply a current capable of generating the switching field Hsw necessary to invert the magnetization of the recording layer.

As a method for reducing a write current in an MRAM, it is reported in, for example, Saied Tehrani, "Magneto resistive RAM", 2001 IEDM short coursew to use a write wiring provided with a yoke covered with a soft magnetic body made of NiFe or the like for a wiring made of Cu.

As a result of studying a case of using the write wiring provided with the yoke described in the above document through an experiment and a computer simulation, an efficient improvement effect of approx. two times ca be confirmed and a write current can be decreased to 5 mA. However, a write current of 5 mA is a limit. Therefore, the value 5 mA is far from reduction of current to 1 to 2 mA which is a target value of a write current necessary for practical use.

Moreover, as a result of quickly writing data at a short-pulse write current of approx. 50 nsec, a necessary write current fluctuates and only a reproducibility can be obtained which is greatly lower than a reproducibility 90% when writing data at a constant write current.

As described above, though a write wiring provided with a yoke is proposed which is obtained by covering the side face of the write wiring with a magnetic layer in order to reduce the write current of an MRAM, it has a write current considerably larger than a target value necessary for practical use. Moreover, as a result of quickly writing data at a short-pulse write current, problems occur that a necessary write current value fluctuates and write reproducibility is low.

Therefore, it is requested that a write current can be reduced and write reproducibility is secured without fluctuation of a write current value even when writing data at a short-pulse write current.

BRIEF SUMMARY OF THE INVENTION

According to an aspect of the present invention, there is provided a magnetic random access memory including: a write wiring constituted by at least one wiring; a magnetic tunnel junction device which is disposed closely to the write wiring and in which information is written in accordance with an induced magnetic flux generated by supplying a current to the write wiring; and a magnetic layer which is provided so as to cover at least a part of a sidewall of the write wiring and formed by grown columnar grains and in which the growing direction of the columnar grains is 30° or less from the normal-line direction of the sidewall.

According to another aspect of the present invention, there is provided a method for manufacturing a magnetic random access memory on a semiconductor substrate, including: forming an insulating film on the semiconductor substrate; forming a trench in the insulating film; though a sputtering method for sputtering the magnetic body, depositing a magnetic layer including at least two of the following three types such as a type having a structure in which the normal-line direction of columnar grains is 30° or less from a sidewall of the trench formed on the insulating film formed on the semiconductor substrate, a type having a structure in which grains are deposited like a layer, and a type having a structure in which grains are amorphously deposited on the sidewall of the trench; and embedding the write wiring in the trench.

According to still another aspect of the present invention, there is provided a method for manufacturing a magnetic random access memory on a semiconductor substrate, including: forming an insulating film on the semiconductor substrate; depositing a wiring material on the insulating layer; patterning the wiring material and thereby forming the write wiring; and depositing a magnetic layer including at least two of the following three types such as a type having a structure in which the growing-direction angle of columnar grains is 30° or less from the normal-line direction of a sidewall of the write wiring, a type having a structure in which grains are deposited like a layer, and a type having a structure in which grains are amorphously deposited on the write wiring through a sputtering method.

BRIEF DESCRIPTION OF THE SEVERAL VIEWS OF THE DRAWING

FIG. 6 is a characteristic diagram showing the characteristic of a resistance-value change according to inversion of an applied magnetic field of the MTJ device shown in FIG. 1;

FIG. 7 is a characteristic diagram showing an asteroid curve of the MTJ device shown in FIG. 1;

FIG. 8 is a perspective view showing a structure of a yoke-provided write wiring;

FIG. 9 is a characteristic diagram schematically showing a state in which the write efficiency is improved when writing data by using the yoke-provided write wiring shown in FIG. 8;

FIG. 14 is an illustration showing a relation between angle θ of the growing direction of the columnar grains shown in FIG. 12 and a write characteristic when using a write wiring corresponding to the angle θ;

FIG. 15 is a characteristic diagram showing a relation between a write current depending on the difference between methods for forming a magnetic layer of the write wiring in FIGS. 10 and 11 and the reproducibility when writing data by a short-pulse write current;

FIG. 16 is a sectional view showing some of steps according to a first embodiment of an MRAM manufacturing method of the present invention;

FIG. 17 is a sectional view showing some of steps according to a second embodiment of the MRAM manufacturing method of the present invention;

FIG. 18 is a sectional view showing some of steps according to a third embodiment of the MRAM manufacturing method of the present invention;

FIG. 19 is a sectional view showing some of steps according to a fourth embodiment of the MRAM manufacturing method of the present invention;

FIG. 20 is a sectional view showing some of steps according to a fifth embodiment of the MRAM manufacturing method of the present invention;

FIG. 21 is a sectional view showing some of steps according to a sixth embodiment of the MRAM manufacturing method of the present invention;

DETAILED DESCRIPTION OF THE INVENTION

Embodiments of the present invention is described below in detail by referring to the accompanying drawings.

Figure 1:
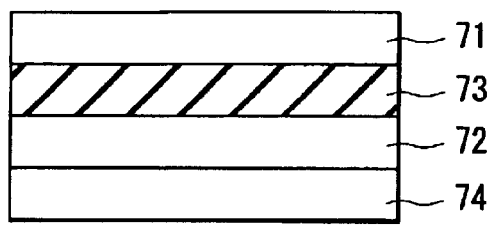
FIG. 1 is a sectional view showing a general structure of an MTJ device for use in an MRAM.

FIG. 1 schematically shows a sectional structure of an MTJ device for use in an MRAM.

An MTJ device has a structure in which a nonmagnetic layer (tunnel barrier film) 73 is held by two magnetic layers 71 and 72 respectively formed by a ferromagnetic layer or a ferromagnetic body. The MTJ device having the above structure stores information of "0" and "1" depending on whether the spin directions of the two magnetic layers 71 and 72 are parallel or antiparallel.

An antiferromagnetic layer 74 is normally disposed to either of the two magnetic layers 71 and 72. The antiferromagnetic layer 74 is a member for easily rewriting the information by fixing the spin direction of one magnetic layer 72 and changing only the spin direction of the other magnetic layer 71. In this case, the magnetic layer 71 at the variable-spin side is referred to as a free layer or recording layer and the magnetic layer 72 at the spin fixed side is referred to as a fixed layer or pin layer.

Figure 2A:
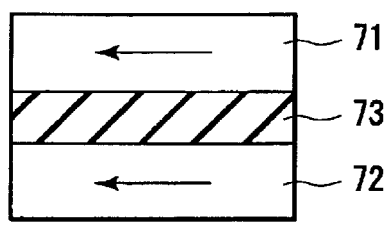
FIGS. 2A and 2B are views showing spin directions of two magnetic layers of the MTJ device in FIG. 1.
Figure 2B:
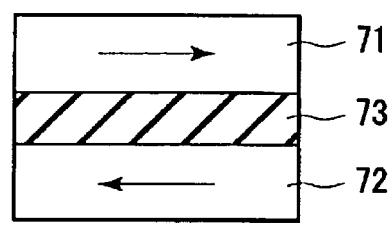

FIGS. 2A and 2B show two states of spin directions of two magnetic layers 71 and 72 of the MTJ device shown in FIG. 1.

As shown in FIG. 2A, when spin directions (directions shown by arrows) of the magnetic layers 71 and 72 are parallel, that is, the same, the tunnel resistance of the tunnel barrier film 73 held by the magnetic layers 71 and 72 is minimized. That is, the tunnel current is maximized.

As shown in FIG. 2B, when spin directions of the magnetic layers 71 and 72 are antiparallel each other, the tunnel resistance of the tunnel barrier film 73 held by the magnetic layers 71 and 72 is maximized, that is, the tunnel current is minimized.

In the case of an MRAM, two states in which resistance values of an MTJ device are different from each other are made to correspond to an information-"1" storing state (state "1") and an information-"0" storing state (state "0").

Figure 3:
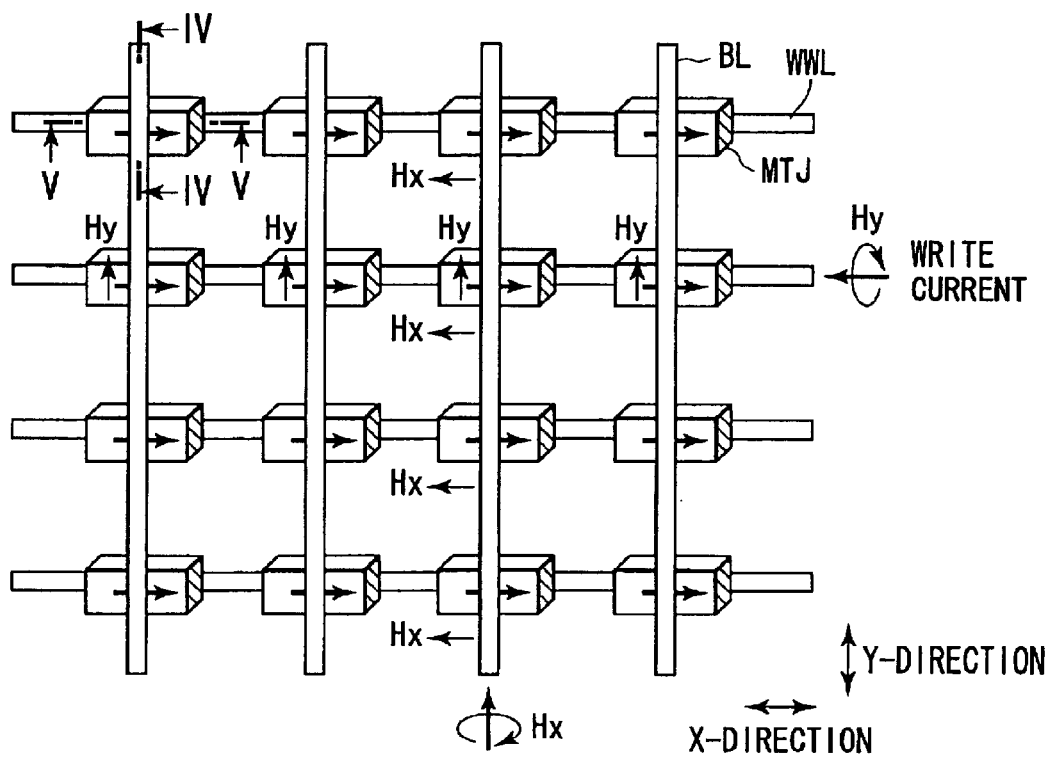
FIG. 3 is an illustration schematically showing a planar layout of a cell array of an MRAM.

FIG. 3 schematically shows a planar layout of a cell array of an MRAM.

A plurality of write/read bit lines BL and a plurality of write word lines WWL are arranged so as to be orthogonal each other and an MTJ device having the structure shown in FIG. 1 is disposed closely to the bit lines BL and write word lines WWL correspondingly to each of intersections between the bit lines BL and the write word lines WWL. Each MTJ device is set such that the major side of a rectangle is parallel with the write word lines WWL and the minor side of the rectangle is parallel with the bit lines BL. Moreover, a spin direction is provided so as to be parallel with the major-side direction. Each bit line BL is electrically connected to each of the fixed layers of the MTJ devices in the same row or column. Each write word line WWL is set so as to closely face each of the MTJ devices in the same column or row.

Figure 4:
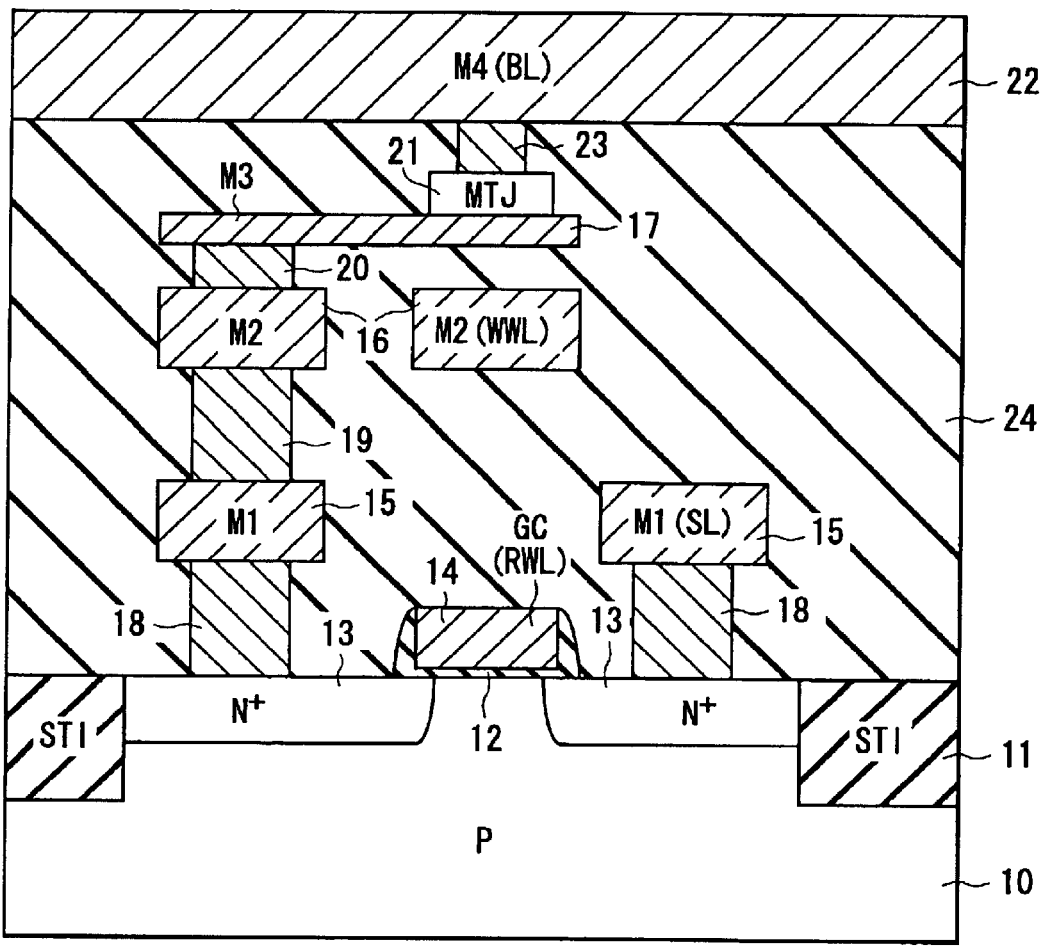
FIG. 4 is a sectional view showing a structure noticing one memory cell in a plane vertical to a bit line along the line IV—IV in FIG. 3.
Figure 5:
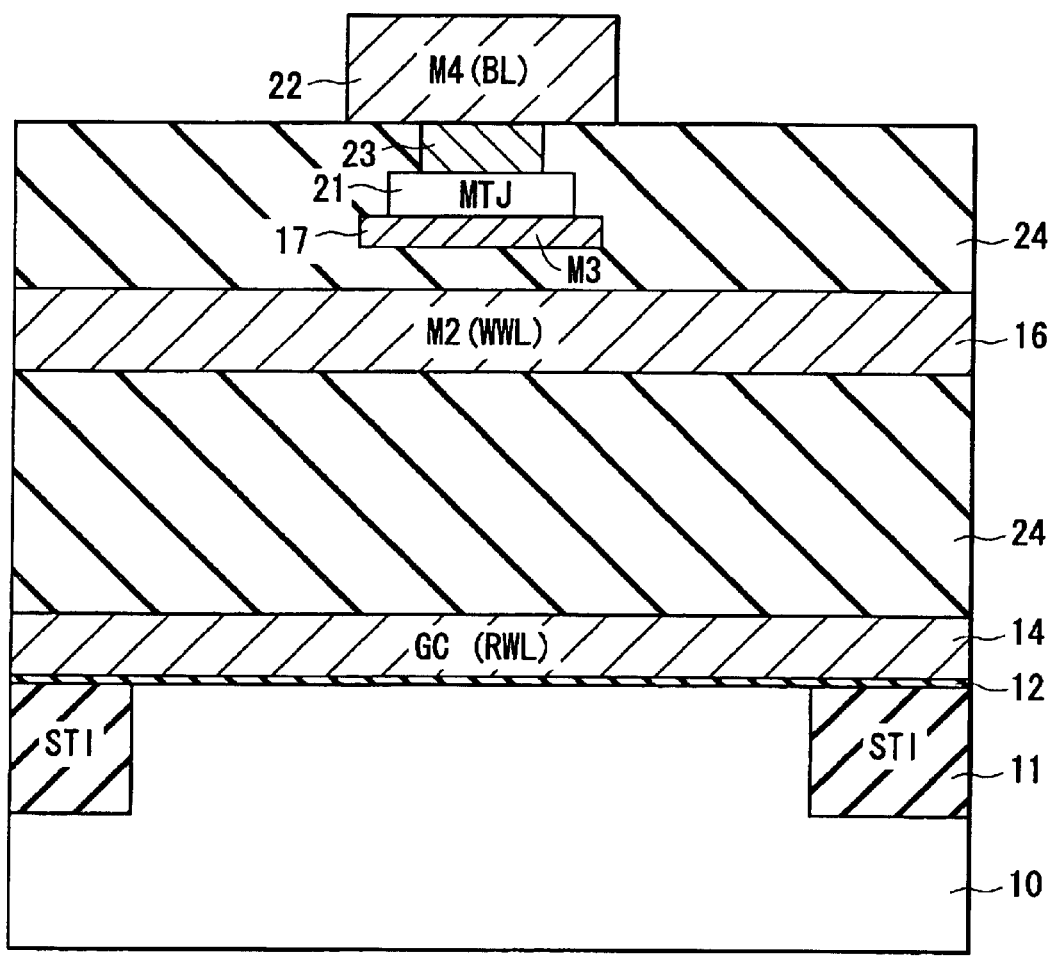
FIG. 5 is a sectional view showing a structure in a plane vertical to a write word line along the line V—V in FIG. 3.

FIGS. 4 and 5 show sectional structures in different directions of one MTJ device in FIG. 3. In FIGS. 4 and 5, reference numeral 10 denotes a semiconductor substrate formed by a P-type Si substrate, 11 denotes a shallow-trench-type isolation region (STI), 12 denotes a gate oxide film, 13 denotes an impurity diffusion layer ($N^+$) serving as a drain region or source region of read-cell selecting transistor (NMOSFET), 14 denotes a gate electrode (GC), 15 denotes a first metal wiring layer (M1), 16 denotes a second metal wiring layer (M2), 17 denotes an MTJ connecting wiring formed by a third metal wiring layer (M3), 18 denotes a conductive contact plug for electrically connecting the first metal wiring layer 15 to the diffusion layer 13, 19 denotes a conductive contact plug for electrically connecting the second metal wiring layer 16 to the first metal wiring layer 15, 20 denotes a conductive contact plug for electrically connecting the third metal wiring layer 17 to the second metal wiring layer 16, 21 denotes an MTJ device, 22 denotes a fourth metal wiring layer (M4), 23 denotes a conductive contact plug for electrically connecting the fourth metal wiring layer 22 to the MTJ device 21, and 24 denotes a interlayer insulating film.

In FIGS. 4 and 5, as purposes of wirings, BL shows a write/read bit line, WWL shows a write word line, SL shows a source line, and RWL shows a read word line. The source line SL is connected to the ground potential.

Then, the principle for writing data in an MTJ device is described below.

Data is written in the MTJ device by supplying a current to the write word line WWL and bit line BL by using magnetic fields generated by the current circulating through the both lines and thereby making spin directions of the MTJ device parallel or antiparallel.

That is, to write information in the MTJ device, a magnetic field Hx is generated by supplying a current proceeding to a first direction or a second direction opposite to the first direction to the bit line BL in accordance with write data and a magnetic field Hx is generated by supplying only a current proceeding to a certain direction to the write word line WWL. Thereby, a resultant magnetic field is generated and information is written by using the resultant magnetic field. In this case, by supplying the current proceeding to the first direction to the bit line BL, spin directions of the MTJ device becomes parallel. However, when supplying the current proceeding to the second direction to the bit line BL, spin directions of the MTJ device become antiparallel.

To read information from the MTJ device, the read word line RWL is activated and only a switching device connected to the selected MTJ device is turned on to form a current route. Then, a current is supplied from the selected bit line BL to the ground potential. As a result, a current corresponding to the resistance value is supplied to only the selected MTJ device and it is possible to read information by detecting the current value.

Then, a mechanism in which spin directions of the MTJ device are changed is briefly described below by referring to FIGS. 6 and 7.

FIG. 6 shows a characteristic (MTJ curve) of a resistance-value change due to inversion of a magnetic field applied to the MTJ device and FIG. 7 shows an asteroid curve of the MTJ device.

As shown in FIG. 6, by applying the magnetic field Hx in the easy-axis direction of the MTJ device, resistance values of the MTJ device are changed by approx. 17%. A change rate which is a ratio between resistances before and after the change is referred to as an MR ratio. The MR ratio depends on the property of a magnetic layer of the MTJ device. At present, an MTJ device having an MR ratio of approx. 50% is obtained. A resultant magnetic field between the magnetic field Hx in the easy-axis direction and the magnetic field in the hard-axis direction is applied to the MTJ device.

As shown by continuous lines and broken lines in FIG. 6, intensities of the magnetic field Hx in the easy-axis direction necessary to change resistance values of the MTJ device are also changed. By using the above phenomenon, it is possible to write data in only an MTJ device disposed correspondingly to the intersection between the selected write word line WWL and the selected bit line BL among memory cells arranged in an array manner.

Namely, as shown in FIG. 7, when the intensity of the resultant magnetic field between the easy-axis-directional magnetic field Hx and the hard-axis-direction magnetic field Hy is present at the outside of the asteroid curve, for example, positions of two black circles in FIG. 7, it is possible to invert the spin direction of the magnetic layer of the MTJ device.

On the contrary, when the magnitude of the resultant magnetic field between the easy-axis-directional magnetic field Hx and the hard-axis-directional magnetic field Hy is present at the inside of the asteroid curve, for example, positions of two white circles in FIG. 7, it is impossible to invert the spin direction of the magnetic layer of the MTJ device.

Therefore, it is possible to control writing data in the MTJ device by changing the intensity of the resultant magnetic field between the easy-axis-directional magnetic field Hx and the hard-axis-direction magnetic field Hy, and by changing positions the intensity of the resultant magnetic field in the Hx-Hy plane.

As described above, it is a largest problem of an MRAM to reduce a write current.

FIG. 8 shows a structure of a yoke-provided write wiring described Saied Tehrani, "Magneto resistive RAM", 2001

IEDM short coursew. Moreover, FIG. 9 shows a characteristic for improving a write efficiency when writing data by using the write wiring shown in FIG. 8. The characteristic A in FIG. 9 shows a state in which a switching magnetic field Hsw is intensified as the MTJ device is further fined in a case of using a CoFeNi thin film having the thickness of 2 nm as the recording layer of the MTJ device.

When using a normal write wiring, it is possible to write data because the generated magnetic field is stronger than the switching magnetic field until 1/F is approx. 7. On the contrary, when using the yoke-provided write wiring described in Saied Tehrani, "Magneto resistive RAM", 2001 IEDM short coursew, it is possible to write data because the generated magnetic field is stronger than the switching magnetic field even if 1/F exceeds approx. 7. However, when 1/F exceeds approx. 10, the generated magnetic field is weaker than the switching magnetic field. That is, it is possible to reduce a write current to 5 mA but the value 5 mA is far from 1 to 2 mA which is a target value necessary for practical use.

As a result of quickly writing data with a write current of a short pulse of approx. 50 nsec, a necessary write current fluctuates and only a reproducibility greatly lower than a reproducibility of 90% when writing data with a constant write current can be obtained.

In the case of the MRAM of the present invention, a part of a write wiring is covered with a magnetic layer and there is a feature in the structure of the magnetic layer. Moreover write wirings respectively covered with a magnetic layer include the bit wiring BL and write word line WWL in FIG. 3.

<First Embodiment of MRAM>

Figure 10:
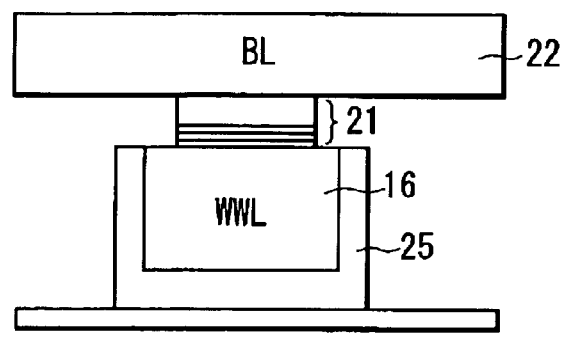
FIG. 10 is an illustration schematically showing an arrangement relation between an MTJ device and a write wiring according to a first embodiment of an MRAM of the present invention.

FIG. 10 schematically shows an arrangement relation between an MTJ device and a write wiring of a memory cell for use in a first embodiment of the MRAM of the present invention. The write word line (WWL) 16 which is one of write word lines is disposed below the MTJ device 21. The bottom face and both sidewalls of the write word line 16 are continuously covered with a magnetic layer 25. The bit line (BL) 22 disposed on the MTJ device 21 is not covered with a magnetic layer.

<Second embodiment of MRAM>

Figure 11:
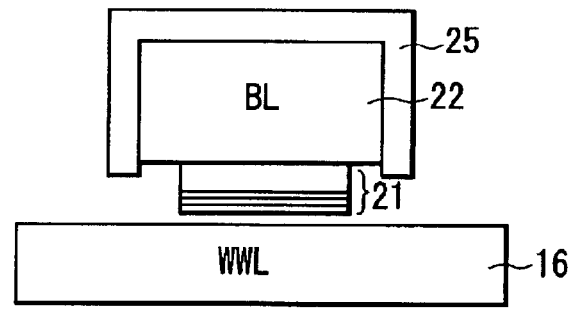
FIG. 11 is an illustration schematically showing an arrangement relation between an MTJ device and a write wiring according to a second embodiment of the MRAM of the present invention.

FIG. 11 schematically shows an arrangement relation between an MTJ device and a write wiring of a memory cell for use in a second embodiment of the MRAM of the present invention. The bit line (BL) 22 which is one of write wirings is disposed on the MTJ device 21. The upper face and both sidewalls of the bit line 22 are continuously covered with the magnetic layer 25. The write word line (WWL) 16 disposed below the MTJ device 21 is not covered with a magnetic layer.

In the case of an MRAM having a memory cell of the structure shown in FIG. 10 or 11, information of "0" and "1" are made to correspond to a resistance value to be changed in accordance with a magnetized arrangement state of two magnetic layers of the MTJ device 21 constituted by two magnetic layers holding a nonmagnetic layer. Information is written by supplying a current to the write word line 16 or the bit line 22 serving as a write wiring disposed closely to the MTJ device 21 to generate an induced magnetic field and changing magnetized directions of a recording layer of the MTJ device 21. The MTJ device 21 is formed on a semiconductor substrate including an SOI (silicon on insulator) substrate or the like.

In FIGS. 10 and 11, the MTJ device 21 has a structure in which a tunnel barrier film is held between a recording layer formed by a magnetic layer and a fixed layer similarly to the structure described above by referring to FIG. 1 and has a magnetoresistive effect. An antiferromagnetic layer is disposed at the fixed layer side.

The write word line 16 or bit line 22 serving as a write wiring is made of, for example, Cu and at least one of the sidewalls of the line 16 or 22, three faces other than one face opposite to the MTJ device 21 in the above embodiments are covered with the magnetic layer 25.

Figure 12:
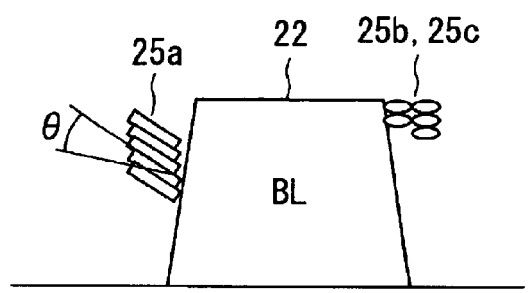
FIG. 12 is a sectional view schematically showing a crystalline state of a magnetic layer for covering sidewalls of the write wiring in FIGS. 10 and 11.

FIG. 12 schematically shows a crystalline state of the magnetic layer 25 covering sidewalls of the write wirings in FIGS. 10 and 11. In this case, a crystalline state of the magnetic layer 25 covering sidewalls of the bit line 22 in the structure shown in FIG. 11 is shown as a typical example. The magnetic layer 25 has at least one or two structures among a portion 125a formed by columnar grains grown from sidewalls of the bit line 22, a portion 25b having a structure in which grains are deposited like a layer, in other words, a layer is granularly grown, and a portion 25c having a structure in which the boundary between grains (grain boundary) is opaquely amorphously deposited.

Figure 13A:
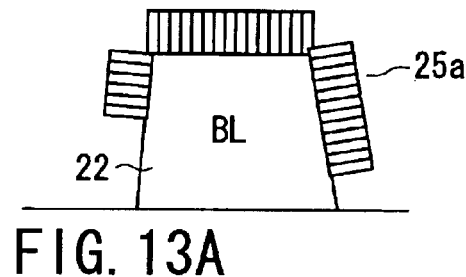
FIGS. 13A to 13C are illustrations schematically showing results of examining the crystalline state of the magnetic layer in FIG. 12 through sectional TEM observation.
Figure 13B:
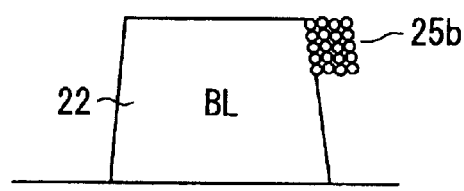
Figure 13C:
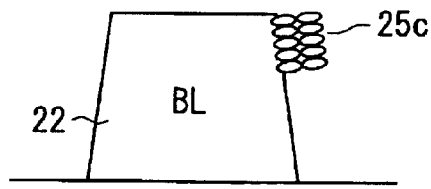

FIGS. 13A to 13C schematically show results of examining crystalline states of parts of the magnetic layers 25a to 25c shown in FIG. 12 through sectional TEM observation.

FIG. 12 and FIGS. 13A to 13C respectively show a case in which the bit line 22 serves as a write wiring. However, the write word line 16 may serve as a write wiring uses.

The magnetic layer 25 of the above embodiments is different from the magnetic layer shown in FIG. 8 in that the layer 25 is formed by at least one of the portions such as the portion 25a having a structure in which the growing direction of columnar grains is 30° or less from the normal-line direction of a sidewall, the portion 25b having a structure in which grains are deposited like a layer, and the portion 25c having a structure in which the boundary between grains is opaquely amorphously deposited.

As a result of studying various manufacturing methods for covering sidewalls of the write wiring with the magnetic layer 25 and forming the magnetic layer 25 through a manufacturing method according to the condition to be described later, a very preferable result is obtained on reduction of the write current and write reproducibility. A result of observing the magnetic layer 25 in detail is described below.

FIG. 14 shows a relation between the angle θ of the growing direction of columnar grains from the normal-line direction of a sidewall shown in FIG. 13A and a write characteristic when using a write wiring corresponding to the angle θ.

When the angle θ formed between the growing direction of columnar grains and the normal line of sidewalls of the bit line 22 is 30° or less as shown in FIG. 12, a write current value greatly decreases from 5 mA which is a prior limit and write reproducibility becomes approx. 100% as can be seen from the characteristic shown in FIG. 14. That is, it is possible to decrease the write current value to less than 5 mA, more accurately, to 1 to 2 mA and the write reproducibility at a short pulse of 50 nsec becomes approx. 100%.

As a result of forming the magnetic layer 25 by various manufacturing methods to be described later and evaluating write characteristics, every characteristic shows a preferable value. As a result of examining the morphology of the magnetic layer 25 in the above case through sectional TEM observation, the following types are found: a type having a structure in which the angle θ formed between the growing direction of columnar grains of the magnetic layer 25 and the normal line of sidewalls of the write wiring is 30° or less, a type having a structure in which grains of the magnetic layer 25 are deposited like a layer, and a type having a structure in which the grain boundary of the magnetic layer 25 is opaquely amorphously deposited.

Namely, in the case of write wirings of the above both embodiments, the crystalline state of the magnetic layer 25 covered with sidewalls is improved. That is, by forming the magnetic layer 25 including any one or two or more of the following three types such as a type having a structure in which the angle θ formed between the growing direction of columnar grains and the normal line of sidewalls of a writing wiring is 30° or less, a type having a structure in which a layer is granularly grown, that is, grains are deposited like a layer, and a type having a structure in which grains are amorphously deposited, it is possible to greatly reduce a write current and realize reproducible writing.

FIG. 15 shows a relation between a write current depending on the difference between manufacturing methods to be described later and the reproducibility when writing data with a short-pulse write current of the magnetic layer 25 formed on the write word line 16 or bit line 22 serving as a write wiring.

For the above embodiments, a case is described in which the magnetic layer 25 is formed on either wiring of the write word line 16 and bit line 22. However, it is also allowed to form the magnetic layer 25 on the both of the write word line 16 and bit line 22.

<First Embodiment of MRAM Manufacturing Method>

FIG. 16 schematically shows a first embodiment of an MRAM manufacturing method of the present invention. This embodiment uses a sputtering method to form a magnetic layer on sidewalls of a write wiring.

In other words, FIG. 16 shows a manufacturing step when forming a write wiring by forming an interlayer insulating film 41 on a semiconductor substrate 40 and a trench 42 on the interlayer insulating film 41 and embedding a write wiring material in the trench 42. This step is applied to a case of forming the write word line 16 serving as a write wiring below the MTJ device 21 as sown in FIG. 10.

First, for example, a Ta layer 43 is deposited on sidewalls of the trench 42 before embedding the write wiring material in the trench 42 formed on the interlayer insulating film (such as SiOx film) 41 on the semiconductor substrate 40. Under the above state, a magnetic body 44 made of NiFe or the like is deposited on the bottom face of the trench 42 and moreover, the magnetic layer 25 made of NiFe or the like is deposited such that the growing direction of columnar grains is 30° or less from the normal-line direction of sidewalls of the trench 42 by using a sputtering method for sputtering the magnetic body 44 with argon (Ar) or the like.

Thereafter, by embedding a write wiring material, for example, Cu in the trench 42, the angle of the magnetic layer 25 is 30° or less from the normal-line direction of sidewalls of the write wiring as shown in FIG. 12.

It is also allowed to form sidewalls of the trench 42 almost vertically to a substrate face or like a taper such that the opening end of the trench 42 becomes wider than the bottom face thereof.

<Second Embodiment of MRAM Manufacturing Method>

FIG. 17 schematically shows a second embodiment of the MRAM manufacturing method of the present invention. This embodiment also uses a sputtering method when forming a magnetic layer on sidewalls of a write wiring.

That is, FIG. 17 shows a manufacturing step when forming a write wiring by forming an interlayer insulating film 41 on a semiconductor substrate 40, depositing a write wiring material on the interlayer insulating film 41, and patterning the write wiring material. This step is applied to a case of forming the bit line 22 serving as a write wiring on the MTJ device 21 as shown in FIG. 11.

First, after depositing a wiring material made of, for example, Cu on the interlayer insulating film (such as SiOx film) 41, the bit line 22 serving as a write wiring is left by patterning the wiring material through RIE (Reactive Ion Etching). Thereafter, a magnetic layer 45 made of NiFe or the like is deposited on the horizontal plane of the substrate and then, a magnetic layer 25 made of NiFe or the like is deposited such that the growing direction of columnar grains is 30° or less from the normal-line direction of sidewalls of the bit line 22 as shown in FIG. 12 by a sputtering method for sputtering the magnetic body 45 with argon (Ar) or the like.

In this case, though there are some magnetic grains directly deposited on sidewalls of the bit line 22 from the cathode electrode of a sputtering apparatus, the growing direction of columnar grains approaches the normal line of the sidewalls in parallel because of the influence of grains deposited from a substrate surface.

Moreover, it is possible to improve the characteristic of the magnetic layer by using the sputtering method in which the flying direction of magnetic grains coming from the cathode electrode of the sputtering apparatus becomes vertical to sidewalls of the bit line 22 in the case of a method for forming a film by tilting the substrate by using IBS (Ion Beam Sputtering) or the like.

Furthermore, it is also effective to apply a bias or ion beam to the substrate.

<Third Embodiment of MRAM Manufacturing Method>

FIG. 18 schematically shows a third embodiment of the MRAM manufacturing method of the present invention. This embodiment uses a sputtering method for ionizing sputter grains when forming a magnetic layer on sidewalls of a write wiring.

That is, FIG. 18 shows a manufacturing step when forming a write wiring by forming an interlayer insulating film 41 on a semiconductor substrate 40, forming a trench 42 on the interlayer insulating film 41, and embedding a write wiring material in the trench 42. This step is used to form the write word line 16 serving as a write wiring below the MTJ device 21 as shown in FIG. 10.

First, for example, a Ta layer 43 is deposited on sidewalls of the trench 42 before embedding the write wiring material in the trench 42 formed on the interlayer insulating film (such as SiOx film) 41 on the semiconductor substrate 40. Thereafter, a magnetic body 44 made of NiFe or the like is deposited on the bottom of the trench 42. Then, by flying ions such as $Ni^+$, $Fe^+$, and $NiFe^+$ obtained by ionizing sputter grains of the magnetic body made of, for example, NiFe on a substrate surface, a magnetic layer 25 is deposited such that the growing direction of columnar grains is 30° or less from the normal-line direction of sidewalls of the trench 42. Thereafter, by embedding a write wiring material, for example, Cu in the trench 42, the angle of the magnetic layer 25 becomes 30° or less from the normal-line direction of sidewalls of the write wiring.

By ionizing and flying sputter grains as described above, a phenomenon appears that the growing direction of columnar grains approaches being parallel with the normal line of sidewalls. Moreover, when an ionization rate exceeds 20%, the above phenomenon becomes extreme.

As described above, a magnetic layer formed by a sputtering method for ionizing sputter grains is improved in write reproducibility compared to a magnetic layer formed by the normal sputtering method.

It is allowed to form sidewalls of the trench 42 to be almost vertical to a substrate surface or like a taper in which opening end of the trench becomes wider than the bottom face thereof.

<Fourth Embodiment of MRAM Manufacturing Method>

FIG. 19 schematically shows a fourth embodiment of the MRAM manufacturing method of the present invention. This embodiment also uses a sputtering method to form a magnetic layer on sidewalls of a write wiring.

That is, FIG. 19 shows a manufacturing step when forming a write wiring by forming an interlayer insulating film 41 on a semiconductor substrate 40, depositing a write wiring material on the interlayer insulating film 41, and patterning the write wiring material. As shown in FIG. 11, the above step is applied to form the bit line 22 serving as a write wiring on the MTJ device 21.

First, the bit line 22 serving as a write wiring is left by depositing a wiring material made of, for example, Cu on the interlayer insulating film (such as SiOx film) 41 and then patterning the wiring material through RIE (Reactive Ion Etching). Then, a magnetic body 45 made of NiFe or the like is deposited on the horizontal plane of the substrate to deposit a magnetic layer 25 made of NiFe or the like such that the growing direction of columnar grains is 30° or less from the normal-line direction of sidewalls of the bit line 22 as shown in FIG. 12 by a sputtering method for sputtering the magnetic body 45 with argon (Ar) or the like.

<Fifth Embodiment of MRAM Manufacturing Method>

FIG. 20 schematically shows a fifth embodiment of the MRAM manufacturing method of the present invention. This embodiment uses a plating method when forming a magnetic layer on sidewalls of a write wiring.

That is, FIG. 20 shows a manufacturing step when forming a write wiring by forming an interlayer insulating film 41 on a semiconductor substrate 40, forming a trench 42 on the interlayer insulating film 41, and embedding a write wiring material in the trench 42. As shown in FIG. 10, the above step is applied to form the write word line 16 serving as a write wiring below the MTJ device 21.

First, a barrier metal formed by a Ta film and a plated seed layer 46 are deposited on sidewalls of the trench 42 before embedding the write wiring material in the trench 42 formed on the interlayer insulating film (such as SiOx film) 41 on the semiconductor substrate 40. Under the above state, a magnetic layer 25 is formed such that the growing direction of columnar grains is 30° or less from the normal-line direction of sidewalls of the trench by a plating method. Thereafter, by embedding the write wiring in the trench 42, the magnetic layer 25 becomes 30° or less from the normal-line direction of sidewalls of the write wiring as shown in FIG. 12.

When using NiFe for the plated seed layer 46, the magnetic layer 25 made of NiFe or the like formed through plating shows a preferable write characteristic in a comparatively wide process condition.

Moreover, by using Cu for the plated seed layer and directly plating and growing NiFe on Cu, it is possible to control a composition with the whole plated film, that is, it is possible to avoid an abnormal composition of a plated initial layer and a preferable write characteristic can be stably obtained.

It is allowed to form sidewalls of the trench 42 almost vertically to a substrate surface or into a taper such that the opening end of the trench becomes wider than the bottom face thereof.

<Sixth Embodiment of MRAM Manufacturing Method>

FIG. 21 schematically shows a sixth embodiment of the MRAM manufacturing method of the present invention. This embodiment also uses a plating method when forming a magnetic layer on sidewalls of a write wiring.

That is, FIG. 21 shows a manufacturing step when forming a write wiring by forming an interlayer insulating film 41 on a semiconductor substrate 40, depositing a write wiring material on the interlayer insulating film 41, and patterning the write wiring material. As shown in FIG. 11, the above step is applied to form the bit line 22 serving as a write wiring on the MTJ device 21.

First, the bit line 22 serving as a writ wiring is left by depositing a wiring material made of, for example, Cu on the interlayer insulating film 41 and then pattering the wiring material through RIE (Reactive Ion Etching). Thereafter, a magnetic layer 25 is formed such that the growing direction of columnar grains is 30° or less from the normal-line direction of sidewalls of the write wiring as shown in FIG. 13A by using a plating method for plating and growing NiFe directly on the bit line 22.

When forming the bit line 22 by using Cu, because the electric resistance of Cu is small, it is possible to cover a magnetic layer having a small film-thickness distribution in a wafer with a diameter of 8 inches and as a result, a memory-chip fabrication yield can be greatly improved.

According to methods of the fifth and sixth embodiments, it is possible to form a magnetic layer (NiFe or the like) obtained through a plating method using NiFe or Cu for a plated seed layer such as a magnetic layer (NiFe or the like) having a structure in which the growing direction of columnar grains is 30° or less from the normal-line direction of sidewalls, a structure in which grains are deposited like a layer, or a structure in which grains are amorphously deposited as shown in FIG. 12. A magnetic layer (NiFe or the like) obtained through a plating method shows a preferable write characteristic under a comparatively-wide process condition.

For each of the above embodiments, a case has been described in which the number of recording layers of the MTJ device is 1. However, each of the above embodiments can be also applied to a case in which the recording layer of the MTJ device is constituted by a multilayer structure.

The MRAM according to the first and second embodiments of the MRAM of the invention may be applied in various examples. Some of the applicable examples are explained below.

APPLICABLE EXAMPLE 1

Figure 22:
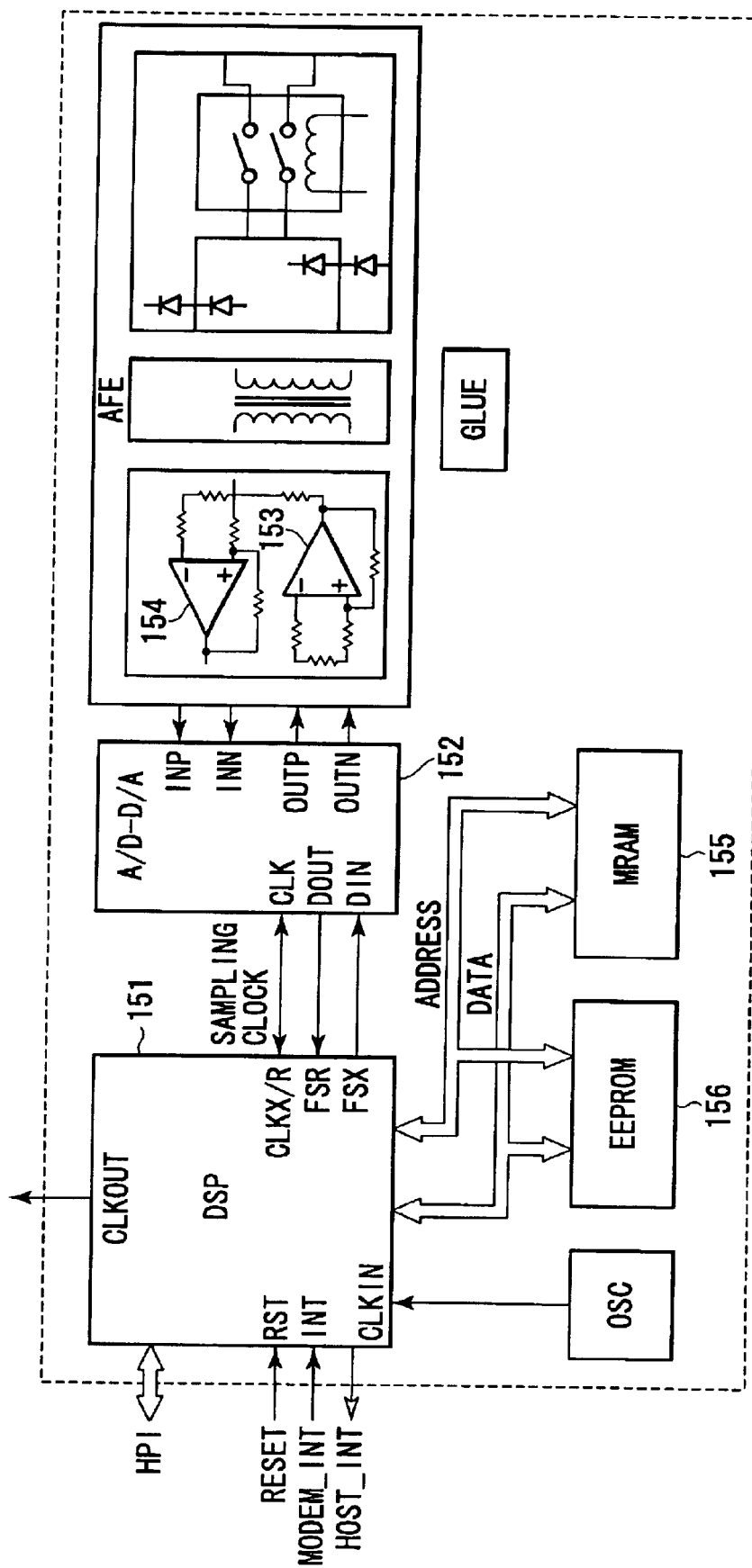
FIG. 22 is a block circuit diagram of a DSL data path portion of a digital subscriber line modem as one of application examples of MRAM.

As one of applicable examples of the MRAM, FIG. 22 shows a digital subscriber line (DSL) data path portion of a digital subscriber line (DSL) modem. This modem includes a programmable digital signal processor (DSP) 151, an analog-to-digital converter (A/D) and digital-to-analog converter (D/A) 152, a transmission driver 153, and a receiver amplifier 154. In FIG. 22, the band pass filter is omitted, and an MRAM 155 and an EEPROM 156 are shown instead as an optional memory of various types capable of holding a line code program.

In this example, as the memory for holding the line code program, two memories MRAM and EEPROM are used, but the EEPROM may be replaced by the MRAM, that is, without using two memories, only the MRAM may be used.

APPLICABLE EXAMPLE 2

Figure 23:
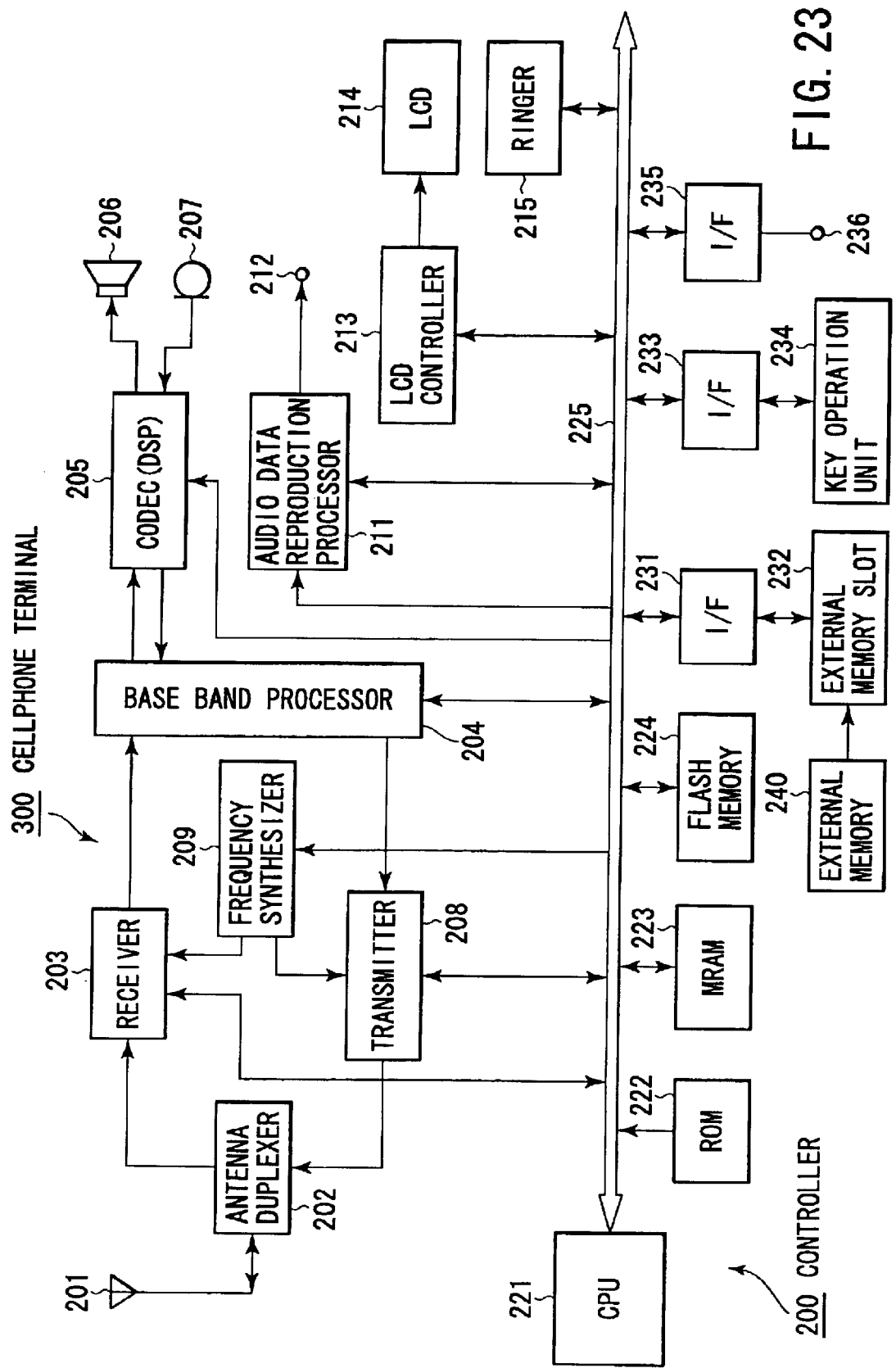
FIG. 23 is a block circuit diagram of a circuit portion for realizing communication function in a cellphone terminal as another application example of MRAM.

As another applicable example of the MRAM, FIG. 23 shows a portion for realizing communication function in a cellphone terminal 300. As shown in FIG. 23, the portion for realizing the communication function comprises a transmission and reception antenna 201, an antenna duplexer 202, a receiver 203, a base band processor 204, a digital signal processor (DSP) 205 used as audio codec, a loudspeaker 206, a microphone 207, a transmitter 208, and a frequency synthesizer 209.

Also as shown in FIG. 23, the cellphone terminal 300 has a controller 200 for controlling the parts of the cellphone terminal. The controller 200 is a microcomputer composed by connecting a CPU 221, a ROM 222, an MRAM 223, and a flash memory 224 by way of a CPU bus 225.

Herein, the ROM 222 preliminarily stores programs to be executed in the CPU 221, and necessary data such as display font. The MRAM 223 is mainly used as a working region, and specifically it is used when storing necessary data in the midst of calculation as required during program execution by the CPU 221, or when temporarily storing data to be used in communications between the controller 200 and other parts. The flash memory 224 stores the immediate preceding setting conditions or the like even if the power source of the cellphone terminal 300 is turned off, or stores the setting parameters when using by setting in the same conditions when the power source is turned on again. That is, the flash memory 224 is a nonvolatile memory holding the stored data even if the power source of the cellphone terminal is turned off.

In this example, the ROM 222, MRAM 223, and flash memory 224 are used, but the flash memory 224 may be replaced by the MRAM, or the ROM 222 may be also replaced by the MRAM.

In FIG. 23, reference numeral 211 is an audio data reproduction processor, 212 is an external terminal connected to the audio data reproduction processor 211, 213 is an LCD controller, 214 is an LCD connected to the LCD controller 213, 215 is a ringer, 231 is an interface (I/F) provided between a CPU bus 225 and an external memory slot 232, 233 is an interface (I/F) provided between the CPU bus 225 and a key operation unit 234, 235 is an interface (I/F) provided between the CPU bus 225 and an external terminal 236, and an external memory 240 is inserted into the external memory slot 232.

APPLICABLE EXAMPLE 3

FIGS. 24 to 28 show an example in which the MRAM is applied in a card holding media contents such as smart media (MRAM card).

Figure 24:
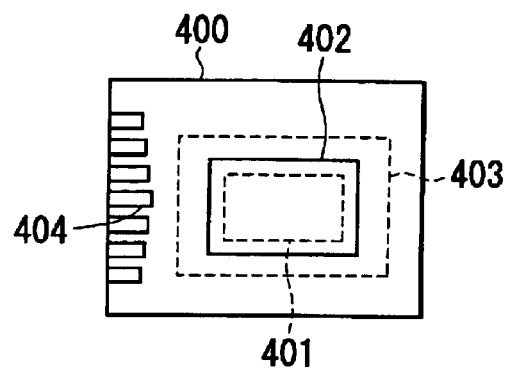
FIG. 24 is a top view showing an example in which the MRAM is applied to an MRAM card.

In a top view in FIG. 24, reference numeral 400 is an MRAM card main body, 401 is an MRAM chip, 402 is an opening, 403 is a shutter, and 404 denotes plural external terminals. The MRAM chip 401 is contained in the MRAM card main body 400, and is exposed to outside through the opening 402. While carrying the MRAM card, the MRAM chip 401 is covered with the shutter 403. The shutter 403 is made of a material having an effect of shielding an external magnetic field, such as ceramic material. When transferring the data, the shutter 403 is released, and the MRAM chip 401 is exposed. The external terminals 404 are for taking out the contents data stored in the MRAM card to outside.

Figure 25:
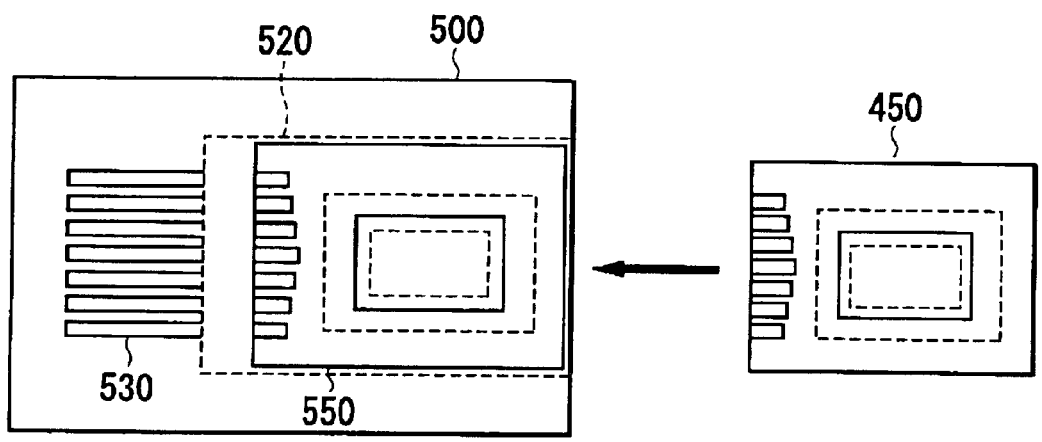
FIG. 25 is a top view of a transfer device of card insert type for transferring data on the MRAM card in FIG. 24.
Figure 26:
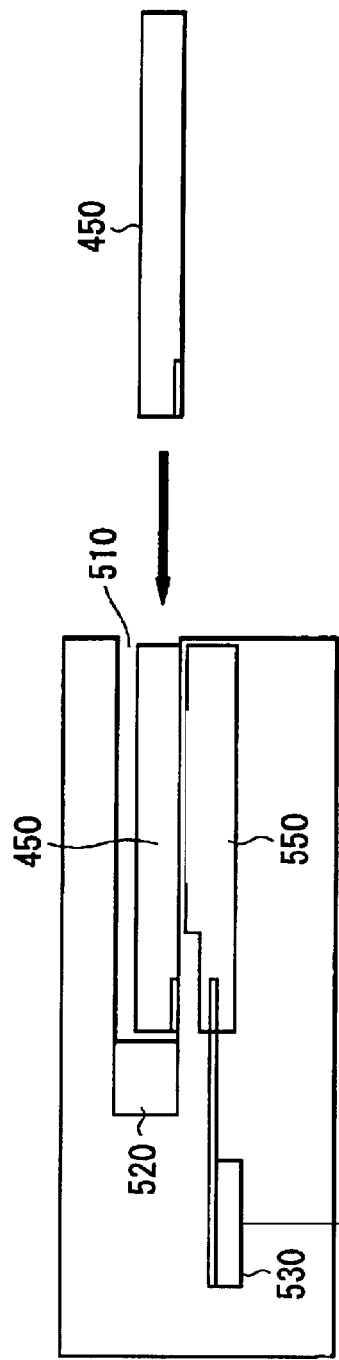
FIG. 26 is a side view of the transfer device in FIG. 25.

FIGS. 25 and 26 are a top view and a side view of a transfer device of card insert type for transferring data on the MRAM card. A second MRAM card 450 used by an end user is inserted from a slit 510 in a transfer device 500, and pushed in until stopped by a stopper 520. The stopper 520 is also used as a member for positioning the first MRAM card 550 and second MRAM card 450. With the second MRAM card 450 disposed at specified position, the data stored in the first MRAM card 550 is transferred into the second MRAM card 450.

Figure 27:
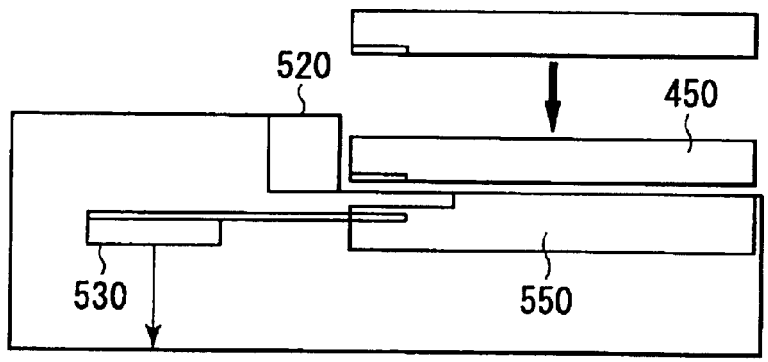
FIG. 27 is a side view of a transfer device of fit-in type for transferring data on the MRAM card in FIG. 24.

FIG. 27 is a side view of a transfer device of fit-in type. As indicated by arrow in the drawing, in this type, aiming at the stopper 520, the second MRAM card 450 is fitted on the first MRAM card 550. The transfer method is same as that in the cart insert type, and explanation is omitted.

Figure 28:
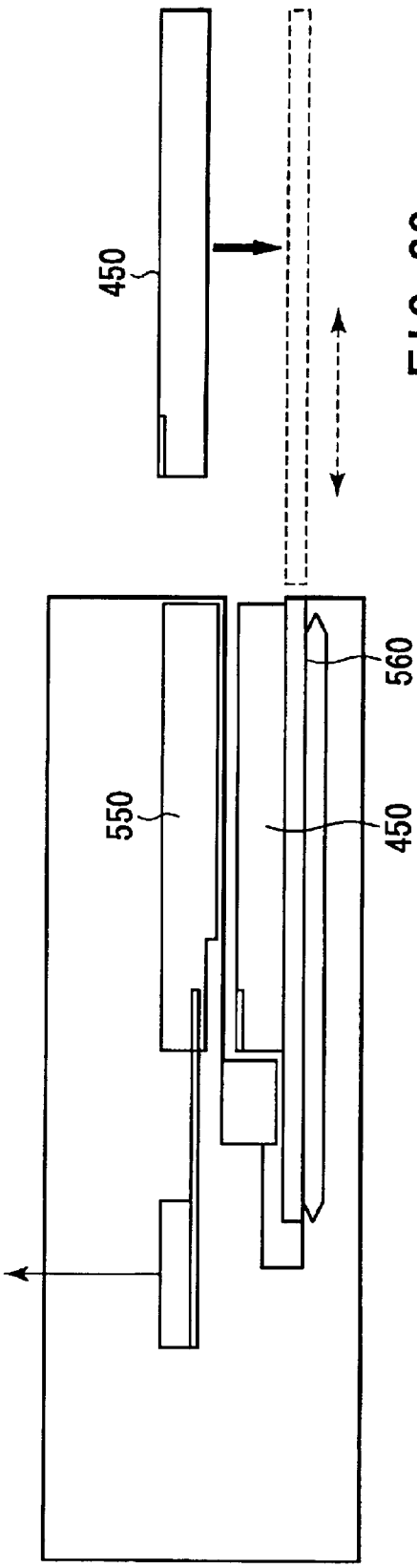
FIG. 28 is a side view of a transfer device of slide type for transferring data on the MRAM card in FIG. 24.

FIG. 28 is a side view of a transfer device of slide type. In the same manner as in the CD-ROM drive or DVD drive, a receiving tray slide 560 is provided in the transfer device 500, and this receiving tray slide 560 slides in the horizontal direction as indicated by arrow in the drawing. When the receiving tray slide 560 moves to the state indicated by the broken line in the drawing, the second MRAM card 450 is put on the receiving tray slide 560. Then, the receiving tray slide 560 conveys the second MRAM card 450 into the inside of the transfer device 500. The second MRAM card 450 is conveyed until its leading end hits against the stopper 520, and the data is transferred, same as in the card insert type, and explanation is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    a write wiring constituted by at least one wiring;
    a magnetic tunnel junction device which is disposed closely to the write wiring and in which information is written in accordance with an induced magnetic flux generated by supplying a current to the write wiring; and
    a magnetic layer which is provided so as to cover at least a part of a sidewall of the write wiring and formed by grown columnar grains and in which the growing direction of the columnar grains is 30° or less from the normal-line direction of the sidewall.

2. The magnetic random access memory according to claim 1, wherein the write wiring serves as a bit line.

3. The magnetic random access memory according to claim 1, wherein the write wiring serves as a write word line.

4. The magnetic random access memory according to claim 1, wherein the write wiring serves as a bit line and a write word line.

5. A magnetic random access memory comprising:
    a write wiring constituted by at least one wiring;
    a magnetic tunnel junction device which is disposed closely to the write wiring and in which information is written in accordance with an induced magnetic flux generated by supplying a current to the write wiring; and
    a magnetic layer including at least two of the following three types such as a type which is provided so as to cover a part of a sidewall of the write wiring and constituted by grown columnar grains and in which the growing direction of the columnar grains is 30° or less from the normal-line direction of the sidewall, a type having a structure in which grains are deposited like a layer, and a type having a structure in which grains are amorphously deposited.

6. The magnetic random access memory according to claim 5, wherein the write wiring serves as a bit line.

7. The magnetic random access memory according to claim 5, wherein the write wiring serves as a write word line.

8. The magnetic random access memory according to claim 5, wherein the write wiring serves as a bit line and a write word line.

* * * * *